(12) United States Patent
Yokokawa et al.

(10) Patent No.: US 8,962,352 B2
(45) Date of Patent: Feb. 24, 2015

(54) METHOD FOR CALCULATING WARPAGE OF BONDED SOI WAFER AND METHOD FOR MANUFACTURING BONDED SOI WAFER

(75) Inventors: Isao Yokokawa, Annaka (JP); Hiroji Aga, Annaka (JP); Yasushi Mizusawa, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 14/240,432

(22) PCT Filed: Aug. 21, 2012

(86) PCT No.: PCT/JP2012/005214
§ 371 (c)(1),
(2), (4) Date: Feb. 24, 2014

(87) PCT Pub. No.: WO2013/046525
PCT Pub. Date: Apr. 4, 2013

(65) Prior Publication Data
US 2014/0186977 A1 Jul. 3, 2014

(30) Foreign Application Priority Data
Sep. 29, 2011 (JP) .................................. 2011-215617

(51) Int. Cl.
*H01L 21/66* (2006.01)
*G01B 11/30* (2006.01)
*G01B 21/20* (2006.01)
*H01L 21/762* (2006.01)

(52) U.S. Cl.
CPC ............. *H01L 22/12* (2013.01); *G01B 11/306* (2013.01); *G01B 21/20* (2013.01); *H01L 22/20* (2013.01); *H01L 21/76256* (2013.01)

USPC ................ 438/14; 257/E21.32; 257/E21.568; 438/458

(58) Field of Classification Search
USPC ................ 257/E21.32, E21.568; 438/14, 458
See application file for complete search history.

(56) References Cited

U.S. PATENT DOCUMENTS

| 5,071,785 | A | 12/1991 | Nakazato et al. |
| 6,284,629 | B1 | 9/2001 | Yokokawa et al. |
| 2008/0128851 | A1* | 6/2008 | Aga et al. ..................... 257/506 |
| 2008/0132032 | A1 | 6/2008 | Tomita et al. |
| 2009/0325385 | A1 | 12/2009 | Tomita et al. |

FOREIGN PATENT DOCUMENTS

| EP | 0 444 943 B1 | 5/1997 |
| JP | A-3-55822 | 3/1991 |

(Continued)

OTHER PUBLICATIONS

International Search Report issued in International Application No. PCT/JP2012/005214 on Oct. 2, 2012 (with translation).

*Primary Examiner* — Asok K Sarkar
(74) *Attorney, Agent, or Firm* — Oliff PLC

(57) ABSTRACT

A method for calculating a warpage of a bonded SOI wafer includes: assuming that the epitaxial growth SOI wafer is a silicon single crystal wafer having the same dopant concentration as dopant concentration of the bond wafer; calculating a warpage A that occurs at the time of performing the epitaxial growth relative to the assumed silicon single crystal wafer; calculating a warpage B caused due to a thickness of the BOX layer of the epitaxial growth SOI wafer; determining a measured value of a warpage of the base wafer before bonding as a warpage C; and calculating a sum of the warpages (A+B+C) as the warpage of the bonded SOI wafer.

8 Claims, 1 Drawing Sheet

(56) References Cited

FOREIGN PATENT DOCUMENTS

| JP | A-3-250615 | 11/1991 |
| JP | A-9-8124 | 1/1997 |
| JP | A-2000-30995 | 1/2000 |
| JP | A-2008-140878 | 6/2008 |
| JP | A-2009-302163 | 12/2009 |

* cited by examiner

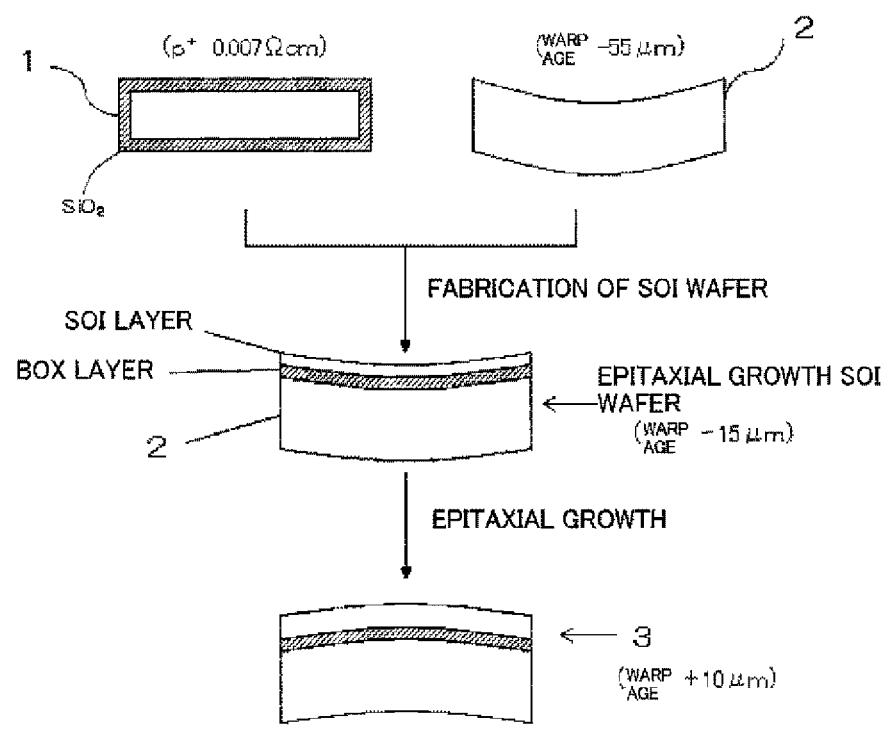

METHOD FOR CALCULATING WARPAGE OF BONDED SOI WAFER AND METHOD FOR MANUFACTURING BONDED SOI WAFER

TECHNICAL FIELD

The present invention relates to a method for calculating a warpage of a bonded SOI wafer and a method for manufacturing a bonded SOI wafer using this calculating method.

BACKGROUND ART

As one of semiconductor device wafers, there is an SOI (Silicon On Insulator) wafer having a silicon layer formed on a silicon oxide film that is an insulator film. This SOI wafer has characteristics such as a small parasitic capacitance, a high radiation resistant capability, and others since a silicon layer (which may be referred to as an SOI layer hereinafter) of a substrate surface layer portion that serves as a device fabrication region is electrically separated from the inside of the substrate by a buried oxide film layer (a BOX layer). Therefore, effects such as a high-speed/low-power consumption operation, prevention of a soft error, and others are expected, and the SOI wafer is expected as a substrate for a high-performance semiconductor device.

As a typical method for manufacturing this SOI wafer, there is a wafer bonding method or an SIMOX method.

The wafer bonding method is, e.g., a method for forming a thermal oxide film on a surface of at least one of two silicon single crystal wafers, then closely attaching the two wafers to each other through this formed thermal oxide film, performing a bonding heat treatment to enhance bonding force, and thereafter reducing a film thickness of one wafer (a wafer for forming an SOI layer (which will be referred to as a bond wafer hereinafter)) by mirror polishing or the like to manufacture an SOI wafer. Further, as a method for reducing the film thickness, there is, e.g., a method for grinding or polishing a bond wafer to a desired thickness or a method for implanting at least either hydrogen ions or rare gas ions into a bond wafer in advance to form an ion implanted layer and delaminating the bond wafer at the ion implanted layer after bonding, and a wafer bonding method adopting the latter method is generally called an ion implantation delamination method.

In general, the SIMOX method is a method for ion-implanting oxygen into a single-crystal silicon substrate, then performing a high-temperature heat treatment (an oxide film forming heat treatment), and reacting the implanted oxygen and silicon with each other to form a BOX layer, thereby manufacturing an SOI substrate.

Of the two typical techniques, since the wafer bonding method has superiority that a thickness of the SOI layer or the BOX layer to be fabricated can be freely set, this method can be applied to use in various devices.

In particular, the ion implantation delamination method as one of the wafer bonding methods has characteristics, i.e., excellent film thickness uniformity in addition to the superiority and can obtain stable device characteristics on an entire wafer surface. However, when a thickness of the SOI layer is as thick as several the ion implantation delamination method alone cannot cope with this thickness since a maximum acceleration voltage of an ion implanter is limited. As a method that can solve this problem, there is a method for performing epitaxial growth on a surface of a bonded wafer fabricated based on the ion implantation delamination method (Patent Document 1). Using this method enables freely setting a thickness of the SOI layer to several μm and also obtaining high uniformity of the SOI layer thickness that cannot be acquired in a bonded wafer based on a grinding/polishing method.

On the other hand, in the bonded SOI wafer, there may be required an SOI wafer in which an SOI layer having a low resistivity (0.1 Ωcm or less) is used as a seed layer and an epitaxial layer having a normal resistivity (approximately 1 to 20 Ωcm) is formed thereon due to requirements in a device configuration.

Meanwhile, it is known that, in the bonded SOI wafer, the SOI layer side warps in a convex shape due to its cross-sectional configuration. When this warpage enlarges, it results into a failure in a photolithography step in a device manufacturing process. Thus, to suppress this warpage of the bonded SOI wafer, Patent Document 2 and Patent Document 3 disclose that a warpage that forms the bonded surface side into a concave shape is previously formed to a base wafer before bonding.

Moreover, Patent Document 4 discloses that a warpage can be reduced by adjusting oxide film thicknesses on upper and lower surfaces (a bonding surface side and a back side) of a base wafer in a bonded SOI wafer fabricated by decreasing a film thickness based on polishing.

Even in case of fabricating the bonded SOI wafer based on the ion implantation delamination method, although the SOI layer side warps in the convex shape due to its cross-sectional configuration, since the SOI layer to be formed is a thin film that is 1 μm or less (several 100 nm or less in many cases) when the SOI layer is formed based on the ion implantation delamination method, the warpage can be sufficiently reduced by equally forming oxide films on the upper and lower surfaces (the bonding surface side and the back side) of the base wafer as described in Patent Document 4.

CITATION LIST

Patent Literature

Patent Document 1: Japanese Unexamined Patent Publication (Kokai) No. 2000-30995
Patent Document 2: Japanese Unexamined Patent Publication (Kokai) No. H03-55822
Patent Document 3: Japanese Unexamined Patent Publication (Kokai) No. 2009-302163
Patent Document 4: Japanese Unexamined Patent Publication (Kokai) No. H03-250615

SUMMARY OF INVENTION

Technical Problem

However, it was revealed that, even if a less-warped bonded SOI wafer is fabricated based on such conventional methods, when an epitaxial layer of approximately several μm is formed on a surface of an SOI layer of the bonded SOI wafer, the SOI wafer disadvantageously greatly warps. In particular, when the epitaxial layer is grown on the SOI layer having a low resistivity, a warpage prominently occurs.

To solve the above-described problem, it is an object of the present invention to provide a method for previously calculating a warpage of a bonded SOI wafer that is fabricated by fabricating an epitaxial growth SOI wafer having a configuration constituted of an SOI layer/a BOX layer/a base wafer and then growing an epitaxial layer on a surface of the SOI layer, and also provide a method for manufacturing a bonded SOI wafer having a desired warpage by using this calculating method.

Solution to Problem

To achieve the object, according to the present invention, there is provided a method for calculating a warpage of a bonded SOI wafer that is fabricated by forming a thermal oxide film on one surface or both surfaces of one of a bond wafer and a base wafer that are formed of silicon single crystal wafers, bonding the bond wafer and the base wafer to each other through the thermal oxide film, then reducing a film thickness of the bond wafer, thereby fabricating an epitaxial growth SOI wafer constituted of a BOX layer on the base wafer and an SOI layer on the BOX layer, and thereafter growing an epitaxial layer on a surface of the SOI layer, the method comprising: assuming that the epitaxial growth SOI wafer is a silicon single crystal wafer having the same dopant concentration as dopant concentration of the bond wafer; calculating a warpage A that occurs at the time of performing the epitaxial growth relative to the assumed silicon single crystal wafer; calculating a warpage B caused due to a thickness of the BOX layer of the epitaxial growth SOI wafer; determining a measured value of a warpage of the base wafer before bonding as a warpage C; and calculating a sum of the warpages (A+B+C) as the warpage of the bonded SOI wafer.

According to such a calculating method, it is possible to calculate the warpage of the bonded SOI wafer without performing the fabrication of the actual epitaxial growth SOI wafer or the epitaxial growth.

In this case, the epitaxial growth SOI wafer is fabricated by an ion implantation delamination method.

Since the ion implantation delamination method has the excellent film uniformity in addition to priority that a thickness of the SOI layer or the like to be fabricated can be freely set, it is applied to use in various devices, and hence the present invention is preferable for manufacture of the bonded wafer by such an ion implantation delamination method.

Additionally, as the bond wafer, a $p^+$ type silicon single crystal wafer that contains boron as a dopant and has dopant concentration of $1E18/cm^3$ ($1 \times 10^{18}/cm^3$) or more and solubility limit concentration or less can be used.

In case of fabricating the bonded SOI wafer by using such a bond wafer, since a warpage is especially apt to occur, the calculating method according to the present invention that enables accurately calculating the warpage is particularly useful.

Further, according to the present invention, there is provided a method for manufacturing a bonded SOI wafer, comprising: forming a thermal oxide film on one surface or both surfaces of one of a bond wafer and a base wafer that are formed of silicon single crystal wafers, bonding the bond wafer and the base wafer to each other through the thermal oxide film, then reducing a film thickness of the bond wafer, thereby fabricating an epitaxial growth SOI wafer constituted of a BOX layer on the base wafer and an SOI layer on the BOX layer, and thereafter growing an epitaxial layer on a surface of the SOI layer, wherein a warpage of the base wafer before bonding is adjusted in such a manner that a warpage calculated by the method for calculating a warpage of a bonded SOI wafer according to any one of claims 1 to 3 has a desired value.

According to the above-described manufacturing method of the present invention, since manufacturing conditions can be adjusted so that the bonded SOI wafer having a desired warpage can be obtained after actual epitaxial growth, it is possible to efficiently manufacture the bonded SOI wafer that is useful as a substrate for a high-performance semiconductor device or the like.

Advantageous Effect of Invention

As described above, according to the calculating method of the present invention, it is possible to calculate a warpage of the bonded SOI wafer, which is fabricated by growing the epitaxial layer on the surface of the SOI layer of the epitaxial growth SOI wafer, without performing actual manufacture. Therefore, a cost can be reduced or a time can be shortened, and hence the method is industrially excellent. Further, at the time of determining specifications of the SOI wafer, this method can be preferably used.

Furthermore, according to the manufacturing method of the present invention, just adjusting a warpage of the unbonded base wafer based on the warpage calculated with use of the calculating method according to the present invention enables easily and assuredly manufacturing the bonded SOI wafer having the warpage of a desired value.

BRIEF DESCRIPTION OF DRAWING

FIG. 1 is a view showing a method for manufacturing an SOI wafer when a bond wafer having a resistivity of 0.007 Ωcm is used in Example 1.

DESCRIPTION OF EMBODIMENTS

The present invention will now be described hereinafter in more detail.

As described above, the present inventors discovered that, even if a bonded SOI wafer which has a decreased warpage is manufactured by a conventional method, when an epitaxial layer was piled up on a surface of an SOI layer of the bonded wafer, there arises a problem that the SOI wafer greatly warps after forming the epitaxial layer even though the warpage of the SOI wafer is small before forming the epitaxial layer.

Thus, to solve such a problem, the present inventors used boron as a dopant, fabricated epitaxial growth SOI wafers having a p+ type (a resistivity of 0.1 Ωcm or less, especially 0.01 Ωcm or less) thin film SOI layer with a different resistivity by the ion implantation delamination method, and grew epitaxial layer on the wafers using SOI layers as seed layer, then conducted an examination in further detail by using these wafers. As a result, they found out that, especially when a resistivity of the epitaxial layer is higher than the resistivity of the SOI layer which is the seed layer (a resistivity higher than 0.1 Ωcm, especially 1 Ωcm or more), the SOI layer side warps in a convex shape.

In general, in case of forming an epitaxial layer on a normal silicon single crystal wafer which is not an SOI wafer, a conventionally known phenomenon is that, when a resistance value in an epitaxial growth silicon wafer is different from a resistance value in the epitaxial layer, a warpage occurs (Patent Document 3 or the like).

However, in case of a bonded SOI wafer, a phenomenon that the SOI layer side greatly warps in a direction along which a convex shape is obtained by just forming an epitaxial layer of several μm on an SOI layer is one even a person skilled in the art cannot expect.

According to the examination conducted by the present inventors, it was found out that, in case of an SOI wafer fabricated by the ion implantation delamination method, the phenomenon that the warpage enlarges when the epitaxial growth is effected on a surface of a p+ type thin film SOI layer is caused due to growing an epitaxial layer having a larger lattice constant on the p+ type thin film (a seed layer) having a smaller lattice constant.

The p+ type SOI layer fabricated by the ion implantation delamination method is a thin film of approximately several 100 nm (or less) and, even though a base wafer (a normal resistivity) having a thickness that is 1000-fold or more of that of the SOI layer is present below this SOI layer through an insulator film such as a silicon oxide film having substantially the same thickness, it seems as if the entire wafer is equivalent to a p+ type silicon single crystal wafer (a p+ type wafer) since respective interfaces of the p+ type thin film SOI layer/the insulator film layer/the base wafer are strongly bonded to each other, and hence it can be considered that a warpage occurs when the resistivity of the epitaxial layer is different from that of the p+ type thin film SOI layer like a case where an epitaxial layer is formed on a regular silicon single crystal wafer having no SOI configuration.

As described above, a phenomenon that the warpage enlarges when the epitaxial growth with low-dopant concentration is effected on a surface of the p+ type thin film SOI layer containing boron as a dopant is caused by a difference in lattice constant due to a difference in dopant concentration between the SOI layer which is the seed layer and the epitaxial layer. Therefore, it was revealed that, even if a dopant other than boron is used or if the epitaxial growth SOI wafer is fabricated by a method other than the ion implantation delamination method, a warpage likewise occurs when the lattice constant of the SOI layer is different from that of the epitaxial layer.

Thus, the present inventors considered that, if a warpage of the bonded SOI wafer fabricated by growing the epitaxial layer on the surface of the SOI layer can be estimated without effecting fabrication of the actual epitaxial growth SOI wafer or the epitaxial growth, manufacturing conditions can be adjusted so that the bonded SOI wafer having a desired warpage can be obtained after the actual epitaxial growth, and they performed the earnest investigation.

As a result, the present inventors discovered that, when the epitaxial growth SOI wafer is assumed to be a silicon single crystal wafer having the same dopant concentration as dopant concentration of the bond wafer having formed the SOI layer and a warpage that occurs at the time of performing the epitaxial growth to the assumed silicon single crystal wafer is calculated, the warpage of the bonded SOI wafer after the epitaxial growth can be estimated, thereby bringing the calculating method and the manufacturing method according to the present invention to completion.

The present invention will now be described hereinafter in detail, but the present invention is not restricted thereto.

The present invention provides a method for calculating a warpage of a bonded SOI wafer that is fabricated by forming a thermal oxide film on one surface or both surfaces of one of a bond wafer and a base wafer that are formed of silicon single crystal wafers, bonding the bond wafer and the base wafer to each other through the thermal oxide film, then reducing a film thickness of the bond wafer, thereby fabricating an epitaxial growth SOI wafer constituted of a BOX layer on the base wafer and an SOI layer on the BOX layer, and thereafter growing an epitaxial layer on a surface of the SOI layer, the method comprising: assuming that the epitaxial growth SOI wafer is a silicon single crystal wafer having the same dopant concentration as dopant concentration of the bond wafer; calculating a warpage A that occurs at the time of performing the epitaxial growth relative to the assumed silicon single crystal wafer; calculating a warpage B caused due to a thickness of the BOX layer of the epitaxial growth SOI wafer; determining a measured value of a warpage of the base wafer before bonding as a warpage C; and calculating a sum of the warpages (A+B+C) as the warpage of the bonded SOI wafer.

Here, as the epitaxial growth SOI wafer, one fabricated by a usual method, e.g., one fabricated by the ion implantation delamination method can be used.

Further, as the bond wafer used here, a silicon single crystal wafer having impurity atoms entirely doped in the whole of the silicon single crystal wafer can be used, and there is a p+ type silicon single crystal wafer containing boron as a dopant and has dopant concentration of $1E18/cm^3$ or more as such a silicon single crystal wafer. It is to be noted that, in this case, an upper limit value of the dopant concentration is not restricted in particular, but it can be, e.g., solubility limit concentration of the dopant in silicon single crystal or lower than the solubility limit concentration.

In this case, as the bond wafer, it is possible to use not only a bond wafer having the dopant uniformly therein but also a bond wafer in which dopant concentration on a bonding surface of the bond wafer is different from that of a bulk portion since an epitaxial layer is provided on the surface, for example. In this case, "the dopant concentration of the bond wafer" means dopant concentration on the bonding surface.

Therefore, the dopant concentration in the bond wafer in the present invention equals to dopant concentration in the SOI layer.

[Method for Calculating Warpage A]

The warpage A is a warpage that occurs when the epitaxial growth SOI wafer is assumed to be a silicon single crystal wafer having the same dopant concentration as dopant concentration in the bond wafer and the epitaxial growth is performed relative to the assumed silicon single crystal wafer.

Considering a situation where the epitaxial layer having a given impurity doped therein with high concentration is formed on the silicon single crystal having high impurity concentration, a distortion e in the epitaxial layer due to mismatching of crystal lattices is represented like the following Expression (1) in the range of elastic deformation.

$$e = \Delta a / a_{Si} \quad (1)$$

where $a_{Si}$ is a lattice constant (5.431 Å) of the silicon single crystal, and $\Delta a$ is a change in lattice constant caused due to introduction of the impurity.

Furthermore, when an epitaxial layer film thickness is constant, the distortion e in the epitaxial layer is proportionate to impurity concentration y in the silicon single crystal wafer as represented by the following Expression (2).

$$e = \beta y \quad (2)$$

where $\beta$ is a proportionality coefficient. The following Expression (3) is generally suggested with respect to this $\beta$.

$$\beta = (1 - r/r_{Si}) \cdot N^{-1} \quad (3)$$

where r is a covalent radius of the impurity atoms, $r_{Si}$ is a bond radius (1.17 Å) of silicon atoms, and N is atom density ($5 \times 10^{22}$ atoms/$cm^3$) of silicon.

It is to be noted that covalent radius (a unit: Å) of the main impurity atoms (a dopant) are as follows. B (boron): 0.88, P (phosphorous): 1.10, Sb (antimony): 1.35, As (arsenic): 1.18

Furthermore, a relationship represented by the following expression (4) is achieved between the distortion e of the epitaxial layer and a radius of curvature R of a bend of the wafer.

$$1/R = 6 t \cdot t_S \cdot e / (t_S + t)^3 \quad (4)$$

where $t_S$ is a thickness of a substrate, and t is a thickness of the epitaxial layer.

If the radius of curvature and a radius of the wafer are known, the warpage A of the wafer can be calculated by using the following Expression (5).

$$A = R - \sqrt{(R^2 - W^2)} \quad (5)$$

where W is a radius of the wafer.
[Reference cited: edited by Koji Sumino, Science and Technology of Crystal Defect Control of Semiconductor, Section of Silicon (Science Forum, 1993)]
For example, in case of using a silicon single crystal wafer having a diameter of 300 mm, a resistivity of 0.005 Ωcm (boron doped), and a wafer thickness of 775 μm (W=1.5E5 μm, y=2.0E19 atoms/cm$^3$, $t_S$=775 μm, $r_{Si}$=1.17 Å, r=0.88 Å) as the bond wafer in the epitaxial growth SOI wafer, the assumed silicon single crystal wafer is a silicon single crystal wafer having a diameter of 300 mm (W=1.5E5 μm, y=2.0E19 atoms/cm$^3$, $t_S$=775 μm, $r_{Si}$=1.17 Å, r=0.88 Å), a resistivity of 0.005 Ωcm (boron doped), and a wafer thickness of 775 μm, and the warpage A at the time of forming an epitaxial layer having a resistivity of 10 Ωcm and a film thickness of 3.4 μm (t=3.4 μm) is calculated as 37.4 μm as described below.

$$\beta = (1 - r/r_{Si}) \cdot N^{-1} = (1 - 0.88/1.17)/5E22 = 4.96E-24$$
$$e = \beta y = 4.96E-24 \times 2.0E19 = 9.91E-5 \; 1/R =$$
$$6t \cdot t_S \cdot e/(t_S + t)^3 = 6 \times 3.4 \times 775 \times 9.91E-5/(775 + 3.4)^3 = 3.32E-9 \; R = 3.01E8$$

$$A = R - \sqrt{(R^2 - W^2)} = 3.01E8 - \sqrt{((3.01E8)^2 - (1.5E5)^2)} = 37.4 \; (\mu m)$$

[Method for Calculating Warpage B]
The warpage B is a warpage resulting from a thickness of the BOX layer in the epitaxial growth SOI wafer, and it is empirically known that this warpage B is strongly dependent on a wafer diameter and a BOX layer thickness.
That is, if the wafer diameter and the thickness of the BOX layer to be fabricated are known in advance, the warpage B can be calculated without fabricating the actual epitaxial growth SOI wafer.
For example, a warpage B (μm) of an SOI wafer (a base wafer thickness: 775 μm) having a diameter of 300 mm is given by the following expression calculated based on experimental data.

$$B = 174 t_b + 15.2$$

where $t_b$ (μm) is a BOX layer thickness.
Further, it is empirically known that a warpage B (μm) of an SOI wafer (a base wafer thickness: 725 μm) having a diameter of 200 mm is given by the following expression.

$$B = 100 t_b$$

At this time, it is known that, if the SOI layer thickness is small, the warpage is not affected.
Warpage data (measured values) when an SOI layer thickness is changed in a wafer having a diameter of 300 mm is shown below.

TABLE 1

| BOX layer thickness[nm] | SOI layer thickness[nm] | Warpage[um] |
|---|---|---|
| 300 | 154 | 68.4 |
| 300 | 204 | 66.6 |
| 300 | 251 | 67.0 |
| 300 | 301 | 68.2 |

Even if the SOI layer thickness is changed in this manner, the warpage hardly varies.
It is to be noted that the above table shows data when the SOI layer thickness is up to approximately 300 nm, but the SOI layer thickness hardly affects the warpage if it is a thickness that can be usually fabricated by the ion implantation delamination method (approximately 1 μm or less).
[Measurement of Warpage C]
The warpage C is a measured value of a warpage of the base wafer at the time of fabricating the epitaxial growth SOI wafer that is specifically before bonding the base wafer to the bond wafer.
A method for measuring the warpage C is not restricted in particular, and measurement can be performed by using, e.g., a warpage measuring instrument (e.g., AFS manufactured by ADE Co.,) so that a size of the warpage (μm) and a direction of the warpage (concave, convex) can be obtained.
It is to be noted that the warpage of the base wafer may be measured in accordance with each wafer, but a difference between respective base wafers is small if these wafers are fabricated under the same processing conditions, and hence one to several base wafers may be sampled and measured, and an average value can be determined as the warpage C of each base wafer.
[Calculation of Sum of Warpages (A+B+C)]
When a sum of the obtained A, B, and C is calculated, a warpage (a size, a direction) of a bonded SOI wafer after epitaxial growth can be acquired.
Based on the thus obtained warpage of the bonded SOI wafer after epitaxial growth, the present invention provides a method for manufacturing a bonded SOI wafer, comprising: forming a thermal oxide film on one surface or both surfaces of one of a bond wafer and a base wafer that are formed of silicon single crystal wafers, bonding the bond wafer and the base wafer to each other through the thermal oxide film, then reducing a film thickness of the bond wafer, thereby fabricating an epitaxial growth SOI wafer constituted of a BOX layer on the base wafer and an SOI layer on the BOX layer, and thereafter growing an epitaxial layer on a surface of the SOI layer, wherein a warpage of the base wafer before bonding is adjusted in such a manner that a warpage calculated by the method for calculating a warpage of a bonded SOI wafer according to the present invention has a desired value.
That is, to make adjustment so that the warpage calculated based on the calculating method according to the present invention can have a desired value (which is determined based on specifications of the SOI wafer), this adjustment can be realized by adjusting a value of the warpage C of the base wafer. Since dopant concentration in the SOI layer (dopant concentration in the bond wafer) and a thickness of the BOX layer is determined based on the specifications and cannot be changed, the warpage of the base wafer to be used is adjusted in advance. In order to realize this adjustment, a base wafer having a necessary warpage (e.g., a wafer having a concave bonding surface) is prepared as the base wafer before bonding. The base wafer having such a shape can be obtained by adjusting how to slice a wafer from a silicon single crystal ingot or leaving a thermal oxide film only on an opposite surface of the bonding surface.

EXAMPLES

Although the present invention will now be more specifically described hereinafter with reference to examples, the present invention is not restricted to the following examples.

Example 1

Dopant in Bond Wafer: B

Assuming that a bonded SOI wafer is manufactured under manufacturing conditions shown in the following Table 2, warpages A and B were calculated, and a warpage of the bonded SOI wafer was calculated based on a sum of warpages A, B and a measured value (a warpage C) of a warpage of the base wafer. Table 3 shows results.

[Manufacturing Conditions]

TABLE 2

| Bond wafer | Diameter: 300 mm, p type, Crystal orientation (100), Oxide film: 145 nm Resistivity: xΩcm, Dopant concentration: y/cm³, Wafer thickness: 775 μm |
|---|---|
| Base wafer | Diameter: 300 mm, p type, Crystal orientation (100), Resistivity: 10Ωcm, Wafer thickness: 775 μm, Warpage: −1 μm (concave) |
| SOI wafer | Ion implantation delamination method, SOI/BOX = 120 nm/145 nm |
| Epitaxial layer | Film thickness: 3.4 μm, Resistivity: 10Ωcm (p type) |

[Result of Calculating Warpage]

TABLE 3

| Bond wafer | | Warpage (μm) | | | |
|---|---|---|---|---|---|
| x (Ωcm) | y (/cm³) | A | B | C | A + B + C |
| 0.1 | 2.8E17 | 0.51 | 40.4 | −1.0 | 39.9 |
| 0.01 | 8.5E18 | 15.8 | 40.4 | −1.0 | 55.2 |
| 0.008 | 1.1E19 | 21.0 | 40.4 | −1.0 | 60.4 |
| 0.007 | 1.3E19 | 24.9 | 40.4 | −1.0 | 64.3 |
| 0.006 | 1.6E19 | 30.1 | 40.4 | −1.0 | 69.5 |
| 0.005 | 2.0E19 | 37.4 | 40.4 | −1.0 | 76.8 |
| 0.003 | 3.6E19 | 67.3 | 40.4 | −1.0 | 106.7 |

[Confirmation Based on Measured Values]

Each bonded SOI wafer subjected to the epitaxial growth under the above-described manufacturing conditions was manufactured with use of each bond wafer having a resistivity of 0.007 Ωcm or 0.006 Ωcm, a warpage of each manufactured wafer was measured, a size of the warpage of each manufactured wafer was 0.65 μm or 70 μm, a direction of the warpage of the same was convex on an SOI layer side (a positive value), and each warpage almost coincided with the above calculation result.

[Manufacture of SOI Wafer Having Desired Warpage] (See FIG. 1)

To fabricate a bonded SOI wafer having a warpage of 20 μm or less after the epitaxial growth and having a convex shape on an SOI layer side by using each bond wafer 1 having a resistivity of 0.007 Ωcm or 0.006 Ωm, a bonded SOI wafer subjected to the epitaxial growth under the same manufacturing conditions was manufactured except that a base wafer 2 having a warpage of −55 μm before bonding (concave on the bonding surface side) was used.

As a result, a size of a warpage of each manufactured bonded SOI wafer 3 was 10 μm or 15 μm, a direction of the warpage of the same was convex on the SOI layer side (a positive value), and it was confirmed that each SOI wafer having a desired warpage (20 μm or less, a convex shape) could be obtained.

Example 2

Dopant in Bond Wafer: P

Assuming that a bonded SOI wafer is manufactured under manufacturing conditions shown in the following Table 4, warpages A and B were calculated, and a warpage of the bonded SOI wafer was calculated based on a sum of warpages A, B and a measured value (a warpage C) of a warpage of a base wafer. Table 5 shows results.

[Manufacturing Conditions]

TABLE 4

| Bond wafer | Diameter: 300 mm, n type, Crystal orientation (100), Oxide film: 145 nm Resistivity: xΩcm, Dopant concentration: y/cm³, Wafer thickness: 775 μm |
|---|---|
| Base wafer | Diameter: 300 mm, p type, Crystal orientation (100), Resistivity: 10Ωcm, Wafer thickness: 775 μm, Warpage : −1 μm (concave) |
| SOI wafer | Ion implantation delamination method, SOI/BOX = 120 nm/145 nm |
| Epitaxial layer | Film thickness: 3.4 μm, Resistivity: 10Ωcm (p type) |

[Results of Calculating Warpage]

TABLE 5

| Bond wafer | | Warpage (μm) | | | |
|---|---|---|---|---|---|
| x (Ωcm) | y (/cm³) | A | B | C | A + B + C |
| 0.1 | 7.8E+16 | 0.0 | 40.4 | −1.0 | 39.4 |
| 0.01 | 4.5E+18 | 2.7 | 40.4 | −1.0 | 42.1 |
| 0.008 | 6.4E+18 | 3.9 | 40.4 | −1.0 | 43.3 |
| 0.007 | 7.8E+18 | 4.7 | 40.4 | −1.0 | 44.1 |
| 0.006 | 9.7E+18 | 5.8 | 40.4 | −1.0 | 45.2 |
| 0.005 | 1.2E+19 | 7.4 | 40.4 | −1.0 | 46.8 |
| 0.003 | 2.2E+19 | 13.5 | 40.4 | −1.0 | 52.9 |

[Confirmation Based on Measured Values]

A bonded SOI wafer subjected to the epitaxial growth under the above-described manufacturing conditions was manufactured with use of a bond wafer having a resistivity of 0.005 Ωcm, a warpage of the manufactured wafer was measured, a size of the warpage was 46 μm, a direction of the warpage was convex on an SOI layer side (a positive value), and the warpage almost coincided with the above calculation result.

In case of using P as a dopant, it was understood that an influence of the warpage A due to a dopant was small and an influence of the warpage B due to a BOX layer thickness was large.

[Manufacture of SOI Wafer Having Desired Warpage]

To fabricate a bonded SOI wafer having a warpage of 20 μm or less after the epitaxial growth and having a convex shape on an SOI layer side by using a bond wafer having a resistivity of 0.005 Ωcm, a bonded SOI wafer subjected to the epitaxial growth under the same manufacturing conditions was manufactured except that a base wafer having a warpage of −32 μm before bonding (concave on the bonding surface side) was used.

As a result, a size of a warpage of the manufactured bonded SOI wafer was 15 μm, a direction of the warpage of the same was convex on the SOI layer side (a positive value), and it was confirmed that the SOI wafer having a desired warpage (20 μm or less, a convex shape) could be obtained.

Example 3

Dopant in Bond Wafer: Sb

Assuming that a bonded SOI wafer is manufactured under manufacturing conditions shown in the following Table 6, warpages A and B were calculated, and a warpage of the bonded SOI wafer was calculated based on a sum of warpages A, B and a measured value (a warpage C) of a warpage of a base wafer. Table 7 shows results.

[Manufacturing Conditions]

TABLE 6

| Bond wafer | Diameter: 300 mm, n type, Crystal orientation (100), Oxide film: 145 nm Resistivity: xΩcm, Dopant concentration: y/cm³, Wafer thickness: 775 μm |
|---|---|
| Base wafer | Diameter: 300 mm, p type, Crystal orientation (100), Resistivity: 10Ωcm, Wafer thickness: 775 μm, Warpage: −1 μm (concave) |
| SOI wafer | Ion implantation delamination method, SOI/BOX = 120 nm/145 nm |
| Epitaxial layer | Film thickness: 4 μm, Resistivity: 10Ωcm (p type) |

[Results of Calculating Warpage]

TABLE 7

| Bond wafer | | Warpage (μm) | | | |
|---|---|---|---|---|---|
| x (Ωcm) | y (/cm³) | A | B | C | A + B + C |
| 0.1 | 7.8E+16 | −0.1 | 40.4 | −1.0 | 39.2 |
| 0.01 | 4.5E+18 | −5.5 | 40.4 | −1.0 | 33.9 |
| 0.008 | 6.4E+18 | −7.8 | 40.4 | −1.0 | 31.6 |
| 0.007 | 7.8E+18 | −9.5 | 40.4 | −1.0 | 29.9 |
| 0.006 | 9.7E+18 | −11.8 | 40.4 | −1.0 | 27.6 |
| 0.005 | 1.2E+19 | −14.9 | 40.4 | −1.0 | 24.5 |
| 0.003 | 2.2E+19 | −27.2 | 40.4 | −1.0 | 12.2 |

[Confirmation Based on Measured Values]

A bonded SOI wafer subjected to the epitaxial growth under the above-described manufacturing conditions was manufactured with use of a bond wafer having a resistivity of 0.01 Ωcm, a warpage of the manufactured wafer was measured, a size of the warpage was 33 μm, a direction of the warpage was convex on an SOI layer side (a positive value), and the warpage almost coincided with the above calculation result.

In case of using Sb as a dopant, although the warpage A due to a dopant was concave (a negative value), the warpage B due to a BOX thickness was convex (a positive value) and large, and hence the SOI layer side warped in a convex shape (a positive value) as a whole.

[Manufacture of SOI Wafer Having Desired Warpage]

To fabricate a bonded SOI wafer having a warpage of 20 μm or less after the epitaxial growth and having a convex shape on an SOI layer side by using a bond wafer having a resistivity of 0.01 Ωcm, a bonded SOI wafer subjected to the epitaxial growth under the same manufacturing conditions was manufactured except that a base wafer having a warpage of −20 μm before bonding (concave on the bonding surface side) was used.

As a result, a size of a warpage of the manufactured bonded SOI wafer was 15 μm, a direction of the warpage of the same was convex on the SOI layer side (a positive value), and it was confirmed that the SOI wafer having a desired warpage (20 μm or less, a convex shape) could be obtained.

Example 4

Dopant in Bond Wafer: As

Assuming that a bonded SOI wafer is manufactured under manufacturing conditions shown in the following Table 8, warpages A and B were calculated, and a warpage of the bonded SOI wafer was calculated based on a sum of warpages A, B and a measured value (a warpage C) of a warpage of a base wafer. Table 9 shows results.

[Manufacturing Conditions]

TABLE 8

| Bond wafer | Diameter: 300 mm, n type, Crystal orientation (100), Oxide film: 145 nm Resistivity: xΩcm, Dopant concentration: y/cm³, Wafer thickness: 775 μm |
|---|---|
| Base wafer | Diameter: 300 mm, p type, Crystal orientation (100), Resistivity: 10Ωcm, Wafer thickness: 775 μm,, Warpage: −1 μm (concave) |
| SOI wafer | Ion implantation delamination method, SOI/BOX = 120 nm/145 nm |
| Epitaxial layer | Film thickness: 4 μm, Resistivity: 10Ωcm (p type) |

[Results of Calculating Warpage]

TABLE 9

| Bond wafer | | Warpage (μm) | | | |
|---|---|---|---|---|---|
| x (Ωcm) | y (/cm³) | A | B | C | A + B + C |
| 0.1 | 7.8E+16 | 0.0 | 40.4 | −1.0 | 39.4 |
| 0.01 | 4.5E+18 | −0.3 | 40.4 | −1.0 | 39.1 |
| 0.008 | 6.4E+18 | −0.4 | 40.4 | −1.0 | 39.0 |
| 0.007 | 7.8E+18 | −0.5 | 40.4 | −1.0 | 38.9 |
| 0.006 | 9.7E+18 | −0.6 | 40.4 | −1.0 | 38.8 |
| 0.005 | 1.2E+19 | −0.8 | 40.4 | −1.0 | 38.6 |
| 0.003 | 2.2E+19 | −1.4 | 40.4 | −1.0 | 38.0 |

[Confirmation Based on Measured Values]

A bonded SOI wafer subjected to the epitaxial growth under the above-described manufacturing conditions was manufactured with use of a bond wafer having a resistivity of 0.005 Ωcm, a warpage of the manufactured wafer was measured, a size of the warpage was 39 μm, a direction of the warpage was convex on an SOI layer side (a positive value), and the warpage almost coincided with the above calculation result.

In case of using As as a dopant, although the warpage due to a dopant was concave (a negative value), its numeral value was very small. Since the warpage due to a BOX thickness was convex (a positive value) and large, and hence the SOI layer side warped in a convex shape (a positive value) as a whole.

[Manufacture of SOI Wafer Having Desired Warpage]

To manufacture a bonded SOI wafer having a warpage of 20 μm or less after the epitaxial growth and having a convex shape on an SOI layer side by using a bond wafer having a resistivity of 0.005 Ωcm, a bonded SOI wafer subjected to the epitaxial growth under the same manufacturing conditions was manufactured except that a base wafer having a warpage of −25 μm before bonding (concave on the bonding surface side) was used.

As a result, a size of a warpage of the manufactured bonded SOI wafer was 15 μm, a direction of the warpage of the same was convex on the SOI layer side (a positive value), and it was confirmed that the SOI wafer having a desired warpage (20 μm or less, a convex shape) could be obtained.

It is to be noted that the present invention is not restricted to the foregoing embodiment. The foregoing embodiment is just an illustrative example, and any example that has substantially the same configuration and exercises the same functions and effects as the technical concept described in claims is included in the technical scope of the present invention.

The invention claimed is:

1. A method for calculating a warpage of a bonded SOI wafer that is fabricated by forming a thermal oxide film on one surface or both surfaces of one of a bond wafer and a base wafer that are formed of silicon single crystal wafers, bonding the bond wafer and the base wafer to each other through the thermal oxide film, then reducing a film thickness of the bond wafer, thereby fabricating an epitaxial growth SOI wafer constituted of a BOX layer on the base wafer and an SOI layer on the BOX layer, and thereafter growing an epitaxial layer on a surface of the SOI layer, the method comprising: assuming that the epitaxial growth SOI wafer is a silicon single crystal wafer having the same dopant concentration as dopant concentration of the bond wafer; calculating a warpage A that occurs at the time of performing the epitaxial growth relative to the assumed silicon single crystal wafer; calculating a warpage B caused due to a thickness of the BOX layer of the epitaxial growth SOI wafer; determining a measured value of a warpage of the base wafer before bonding as a warpage C; and calculating a sum of the warpages (A+B+C) as the warpage of the bonded SOI wafer.

2. The method for calculating a warpage of a bonded SOI wafer according to claim 1, wherein the epitaxial growth SOI wafer is fabricated by an ion implantation delamination method.

3. The method for calculating a warpage of a bonded SOI wafer according to claim 2, wherein, as the bond wafer, a $p^+$ type silicon single crystal wafer that contains boron as a dopant and has dopant concentration of $1E18/cm^3$ or more and solubility limit concentration or less is used.

4. A method for manufacturing a bonded SOI wafer, comprising: forming a thermal oxide film on one surface or both surfaces of one of a bond wafer and a base wafer that are formed of silicon single crystal wafers, bonding the bond wafer and the base wafer to each other through the thermal oxide film, then reducing a film thickness of the bond wafer, thereby fabricating an epitaxial growth SOI wafer constituted of a BOX layer on the base wafer and an SOI layer on the BOX layer, and thereafter growing an epitaxial layer on a surface of the SOI layer, wherein a warpage of the base wafer before bonding is adjusted in such a manner that a warpage calculated by the method for calculating a warpage of a bonded SOI wafer according to claim 3 has a desired value.

5. A method for manufacturing a bonded SOI wafer, comprising: forming a thermal oxide film on one surface or both surfaces of one of a bond wafer and a base wafer that are formed of silicon single crystal wafers, bonding the bond wafer and the base wafer to each other through the thermal oxide film, then reducing a film thickness of the bond wafer, thereby fabricating an epitaxial growth SOI wafer constituted of a BOX layer on the base wafer and an SOI layer on the BOX layer, and thereafter growing an epitaxial layer on a surface of the SOI layer, wherein a warpage of the base wafer before bonding is adjusted in such a manner that a warpage calculated by the method for calculating a warpage of a bonded SOI wafer according to claim 2 has a desired value.

6. The method for calculating a warpage of a bonded SOI wafer according to claim 1, wherein, as the bond wafer, a $p^+$ type silicon single crystal wafer that contains boron as a dopant and has dopant concentration of $1E18/cm^3$ or more and solubility limit concentration or less is used.

7. A method for manufacturing a bonded SOI wafer, comprising: forming a thermal oxide film on one surface or both surfaces of one of a bond wafer and a base wafer that are formed of silicon single crystal wafers, bonding the bond wafer and the base wafer to each other through the thermal oxide film, then reducing a film thickness of the bond wafer, thereby fabricating an epitaxial growth SOI wafer constituted of a BOX layer on the base wafer and an SOI layer on the BOX layer, and thereafter growing an epitaxial layer on a surface of the SOI layer, wherein a warpage of the base wafer before bonding is adjusted in such a manner that a warpage calculated by the method for calculating a warpage of a bonded SOI wafer according to claim 6 has a desired value.

8. A method for manufacturing a bonded SOI wafer, comprising: forming a thermal oxide film on one surface or both surfaces of one of a bond wafer and a base wafer that are formed of silicon single crystal wafers, bonding the bond wafer and the base wafer to each other through the thermal oxide film, then reducing a film thickness of the bond wafer, thereby fabricating an epitaxial growth SOI wafer constituted of a BOX layer on the base wafer and an SOI layer on the BOX layer, and thereafter growing an epitaxial layer on a surface of the SOI layer, wherein a warpage of the base wafer before bonding is adjusted in such a manner that a warpage calculated by the method for calculating a warpage of a bonded SOI wafer according to claim 1 has a desired value.

* * * * *